(12) United States Patent
Nakayama

(10) Patent No.: US 7,548,408 B2
(45) Date of Patent: *Jun. 16, 2009

(54) CAPACITOR AND ITS MANUFACTURING METHOD

(75) Inventor: Masao Nakayama, Chino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/626,555

(22) Filed: Jan. 24, 2007

(65) Prior Publication Data

US 2007/0201182 A1 Aug. 30, 2007

(30) Foreign Application Priority Data

Feb. 24, 2006 (JP) .............................. 2006-048442

(51) Int. Cl.
- *H01G 4/06* (2006.01)
- *H01G 7/00* (2006.01)
- *H02N 2/00* (2006.01)
- *H01L 41/00* (2006.01)
- *H01L 21/00* (2006.01)
- *H01L 21/8242* (2006.01)

(52) U.S. Cl. ..................... 361/311; 29/25.42; 310/354; 438/3; 438/240

(58) Field of Classification Search ................. 361/311, 361/313; 310/363, 364; 438/3, 240; 29/25.42
See application file for complete search history.

(56) References Cited

U.S. PATENT DOCUMENTS 5,798,903 A * 8/1998 Dhote et al. ............. 361/321.4

6,635,498 B2 * 10/2003 Summerfelt et al. ........... 438/3
6,649,954 B2 * 11/2003 Cross ......................... 257/295
7,291,960 B2 * 11/2007 Iwashita et al. ............. 310/363
2003/0062553 A1 * 4/2003 Ramesh et al. .............. 257/295
2006/0273366 A1 * 12/2006 Ko et al. ..................... 257/295

FOREIGN PATENT DOCUMENTS

JP 11-354510 12/1999

OTHER PUBLICATIONS

"Effect of textured LaNiO3 electrode on teh fatigue improvement of Pb(Zr0.53Ti0.47) thin films", Ming-Sen Chen, Tai-Bor Wu and Jenn-Ming Wu, 1996 American Institute of Physics, Appl. Phys. Lett. 68 (10), Mar. 4, 1996 (pp. 1430-1432).*
"Low-Temperature growth of epitaxial LaNiO3/Pb(Zr0.52Ti0.48)O3/LaNiO3 on Si(001) by pulsed-laser deposition", Webin Wu, K.H. Wong and C.L. Choy, 2000 American Vacuum Society, J. Vac. Sci. Technol.A 18(1), Jan./Feb. 2000, (pp. 79-82).*
Lanthanum Nickel oxide GFS—Chemicals.*

* cited by examiner

*Primary Examiner*—Eric Thomas
*Assistant Examiner*—David M Sinclair
(74) *Attorney, Agent, or Firm*—Harness, Dickey & Pierce, P.L.C.

(57) ABSTRACT

A method for manufacturing a capacitor includes the steps of: forming a conductive layer above a base substrate; forming a dielectric layer above the conductive layer; forming a lanthanum nickelate layer above the dielectric layer; and patterning at least the dielectric layer by using at least the lanthanum nickelate layer as a mask.

7 Claims, 4 Drawing Sheets

CAPACITOR AND ITS MANUFACTURING METHOD

The entire disclosure of Japanese Patent Application No. 2006-048442, filed Feb. 24, 2006 is expressly incorporated by reference herein.

BACKGROUND

1. Technical Field

The present invention relates to capacitors and methods for manufacturing the same.

2. Related Art

When capacitors to be used for ink jet recording heads, ferroelectric memories and the like are fabricated, dielectric materials such as PZT and electrode materials such as Pt are used. Because the aforementioned materials are difficult to be etched, fine processing may be very difficult. For example, when etching is conducted with resist masks, side surfaces of dielectric layers and electrodes may have a gentler slope, as their etching selection ratio is small, and steep etching cannot be achieved.

In this connection, for example, Japanese laid-open patent application JP-A-11-354510 describes a technology to etch electrode material such as Pt wherein hard masks composed of TiN or the like other than resist masks are used as masks, and oxygen is added to etching gas. On the other hand, because PZT composing a dielectric layer is an oxide material, etching that is conducted with etching gas and oxygen added thereto may lower the etching rate, cause a micro-loading phenomenon and the like. For example, an etching selection ratio of PZT to a TiN mask may become about 1.

SUMMARY

In accordance with an advantage of some aspects of the invention, it is possible to provide a method for manufacturing capacitors that can be micro-processed, and capacitors obtained by the manufacturing method.

In accordance with an embodiment of the invention, a method for manufacturing a capacitor includes the steps of: forming a conductive layer above a base substrate; forming a dielectric layer above the conductive layer; forming a lanthanum nickelate layer above the dielectric layer; and patterning at least the dielectric layer by using at least the lanthanum nickelate layer as a mask.

According to the method for manufacturing a capacitor described above, the lanthanum nickelate layer has etching characteristics in which its reactivity is low to an etching gas with which etching of the dielectric layer can be conducted well, and its etching rate is lower than that of the dielectric layer even in etching that uses physical actions. Accordingly, the lanthanum nickelate layer can function as an excellent hard mask in etching the dielectric layer. By this, steep etching can be conducted, and therefore a micro-processed capacitor can be provided.

It is noted that, in the descriptions concerning the invention, the term "above" may be used, for example, as "a specific element (hereafter referred to as "A") is formed 'above' another specific element (hereafter referred to as "B")." In this case, the term "above" is used, assuming that the term includes a case in which A is formed directly on B, and a case in which A is formed above B through another element.

In the method for manufacturing a capacitor in accordance with an aspect of the embodiment, the dielectric layer may be formed to be composed of a perovskite oxide expressed by a general formula $ABO_3$, wherein the element A may be formed to include lead (Pb), and the element B may be formed to include at least one of zirconium (Zr) and titanium (Ti).

The method for manufacturing a capacitor in accordance with an aspect of the embodiment may include the step of applying plasma processing to at least the lanthanum nickelate layer, after the step of patterning.

The method for manufacturing a capacitor in accordance with an aspect of the embodiment may include the step of forming another lanthanum nickelate layer, before the step of forming the dielectric layer, wherein the step of patterning is conducted until the other lanthanum nickelate layer is exposed.

The method for manufacturing a capacitor in accordance with an aspect of the embodiment may include, after the step of patterning, the step of removing at least a portion of at least one of the lanthanum nickelate layer and the other lanthanum nickelate layer.

A capacitor in accordance with an embodiment of the invention includes: a base substrate; a conductive layer formed above the base substrate; a dielectric layer formed above the conductive layer; a lanthanum nickelate layer formed above the dielectric layer; and a silicon oxide layer that is in contact with at least the lanthanum nickelate layer.

In the capacitor in accordance with an aspect of the embodiment of the invention, the silicon oxide layer may cover at least the dielectric layer.

The capacitor in accordance with an aspect of the embodiment of the invention may include another conductive layer formed above the dielectric layer and below the lanthanum nickelate layer, wherein the conductive layer may be composed of at least one of a precious metal, an oxide of the precious metal and an alloy formed from the precious metal.

It is noted that, in the descriptions concerning the invention, the term "above" may be used, for example, as "a specific element (hereafter referred to as "A") is formed 'above' another specific element (hereafter referred to as "B")." In this case, the term "above" is used, assuming that the term includes a case in which A is formed directly on B, and a case in which A is formed above B through another element.

In the capacitor in accordance with an aspect of the embodiment of the invention, the silicon oxide layer may be in contact with a side surface and an upper surface of at least the lanthanum nickelate layer.

The capacitor in accordance with an aspect of the embodiment of the invention may include another conductive layer formed above the lanthanum nickelate layer, wherein the other conductive layer may be composed of at least one of a precious metal, an oxide of the precious metal and an alloy formed from the precious metal.

In the capacitor in accordance with an aspect of the embodiment of the invention, the silicon oxide layer may be in contact with a side surface of at least the lanthanum nickelate layer.

The capacitor in accordance with an aspect of the embodiment of the invention may include another lanthanum nickelate layer formed below the dielectric layer, wherein the silicon oxide layer may be in contact with the other lanthanum nickelate layer.

In the capacitor in accordance with an aspect of the embodiment of the invention, the conductive layer may be formed below the other lanthanum nickelate layer, and composed of at least one of a precious metal, an oxide of the precious metal and an alloy formed from the precious metal.

In the capacitor in accordance with an aspect of the embodiment of the invention, the conductive layer may be formed above the other lanthanum nickelate layer, and composed of at least one of a precious metal, an oxide of the precious metal and an alloy formed from the precious metal.

In the capacitor in accordance with an aspect of the embodiment of the invention, the silicon oxide layer may be in contact with an upper surface of at least the other lanthanum nickelate layer.

DESCRIPTION OF EXEMPLARY EMBODIMENTS

Preferred embodiments of the invention are described below with reference to the accompanying drawings.

1. First, a method for manufacturing a capacitor and a capacitor that is obtained by the manufacturing method, in accordance with an embodiment of the invention, are described. FIGS. 1-6 are cross-sectional views schematically showing the steps of the method for manufacturing a capacitor in accordance with the present embodiment.

Figure 1:
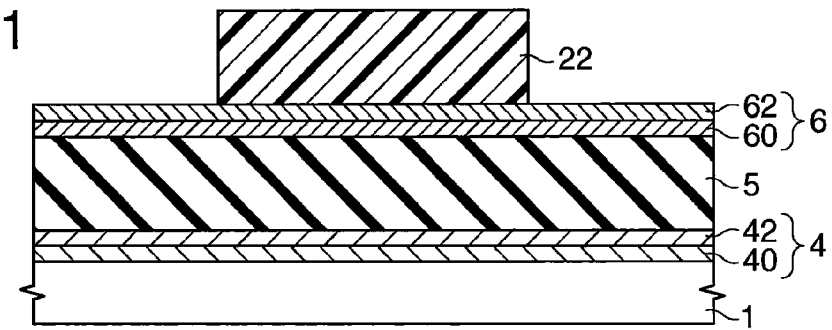
FIG. 1 is a cross-sectional view schematically showing a step of a method for manufacturing a capacitor in accordance with an embodiment of the invention.

First, as shown in FIG. 1, layers for a lower electrode 4, a dielectric layer 5 and an upper electrode 6 are successively laminated over a base substrate 1. The lower electrode 4 is formed by successively laminating, for example, a conductive layer (hereafter referred to as a "first conductive layer") 40, and a lanthanum nickelate (LaNiO3) layer (hereafter referred to as a "first LNO layer") 42. The upper electrode 6 is formed by successively laminating, for example, another conductive layer (hereafter referred to as a "second conductive layer") 60, and another lanthanum nickelate (LaNiO3) layer (hereafter referred to as a "second LNO layer") 62. It is noted that, instead of the base substrate 1, a single body of a lower electrode 4 may be prepared, and a dielectric layer 5 and an upper electrode 6 may be successively laminated on the lower electrode 4. Further, the upper electrode 6 may be formed by laminating only the second LNO layer 62, without forming the second conductive layer 60000.

As the base substrate 1, for example, a semiconductor substrate may be used without any particular limitation. The base substrate 1 may be formed from a single body of a substrate, or a laminated body formed from a substrate and another layer laminated on the substrate. The first conductive layer 40 may be composed of, for example, at least one of a precious metal, an oxide of the precious metal and an alloy composed of the precious metal. As the precious metal, for example, Pt, Ir, Ru and the like can be enumerated. The first conductive layer 40 may be formed by, for example, a sputter method, a vacuum vapor deposition method, or the like. The film thickness of the first conductive layer 40 may be, for example, about 150 nm.

The first LNO layer 42 may be formed by, for example, a sputter method or a sol-gel method. In particular, the first LNO layer 42 may preferably be formed by using a RF sputter method with an oxide of La and Ni including an oxide of silicon (Si) as being its dielectric target material. $LaNiO_3$ formed by this method is oriented to (100), and can include Si. In the RF sputter method, for example, argon and oxygen or argon gas alone may be used as sputter gas. In the description concerning the invention, for example, the expression "orientation to (100)" may include a case where all of the crystals are oriented to (100), and a case where almost all of the crystals are oriented to (100), and the remaining crystals that are not oriented to (100) are oriented to (110). In other words, being "oriented to (100)" can be "preferentially oriented to (100)." This similarly applies to, for example, "orientation to (111)" in the present embodiment of the invention. The film thickness of the first LNO layer 42 may be, for example, about 80 nm.

The dielectric layer 5 may be composed of a ferroelectric or piezoelectric material. The dielectric layer 5 may be composed of a perovskite oxide expressed by a general formula $ABO_3$, where the element A can include Pb, and the element B can include at least one of Zr and Ti. The element B may further include, for example, niobate (Nb). More concretely, as the dielectric layer 5, for example, lead zirconate titanate (Pb (Zr, Ti) $O_3$: PZT), lead titanate ($PbTiO_3$), lead zirconate titanate niobate (Pb (Zr, Ti, Nb) $O_3$) (hereafter also referred to as "PZTN") or the like can be used. It is noted that PZTN is a dielectric substance in which Nb is added in PZT.

Also, the element A in the general formula $ABO_3$ may include, for example, Bi, La, Sr, Ca, Ba or the like, in addition to Pb. These elements can be included at the A site at a ratio of 20% or less. Also, Si may be added to the perovskite oxide expressed by the general formula $ABO_3$.

Also, the ferroelectric layer 5 may be formed with, for example, $SrBi_2Ta_2O_9$ (SBT). At least one of Si and Nb may be added to SBT.

The ferroelectric layer 5 may be formed by, for example, a sol-gel method, a metal organic decomposition (MOD) method, or the like. The film thickness of the dielectric layer 5 may be, for example, about 1.1 μm.

The second conductive layer 60 may be composed of at least one of a precious metal, an oxide of the precious metal and an alloy formed from the precious metal, like the first conductive layer 40. The second conductive layer 60 may be formed by, for example, a sputter method, a vapor deposition method or the like. The film thickness of the second conductive layer 60 may be, for example, about 50 nm.

The second LNO layer 62 may be formed by, for example, a sputter method or a sol-gel method. Also, the second LNO layer 62 may preferably be formed by using a RF sputter method with an oxide of La and Ni including an oxide of silicon (Si) as being its dielectric target material, like the first LNO layer 42. LaNiO$_3$ formed by this method is oriented to (100), and can include Si. In the RF sputter method, for example, argon and oxygen, or argon alone may be used as sputter gas. The film thickness of the second LNO layer 62 may be, for example, about 100 nm.

Next, as shown in FIG. 1, a resist layer 22 is formed in a desired region on the second LNO layer 62 by a known method. The film thickness of the resist layer 22 may be, for example, about 2 μm.

Figure 2:
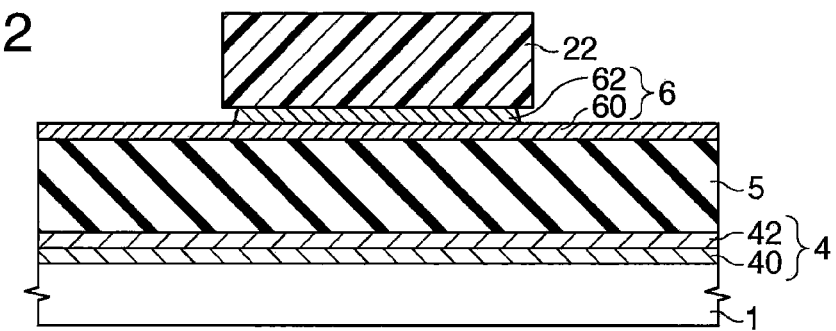
FIG. 2 is a cross-sectional view schematically showing a step of the method for manufacturing a capacitor in accordance with an embodiment of the invention.

(2) Next, as shown in FIG. 2, the second LNO layer 62 is etched by using the resist layer 22 as a mask. Patterning of the second LNO layer 62 may be conducted by, for example, wet etching with diluted nitric acid, hydrogen hexafluorosilicate solution or the like. Also, the second LNO layer 62 may be patterned by, for example, dry etching. The second LNO layer 62 may be side-etched, as shown in FIG. 2, in a manner to recede inside the resist layer 22. Although not shown, the resist layer 22 may be removed by a known method, if necessary.

(3) Next, a patterning step in which at least the dielectric layer 5 is etched is conducted by using at least the second LNO layer 62 as a mask. As a concrete example, the patterning step may be conducted as follows.

Figure 3:
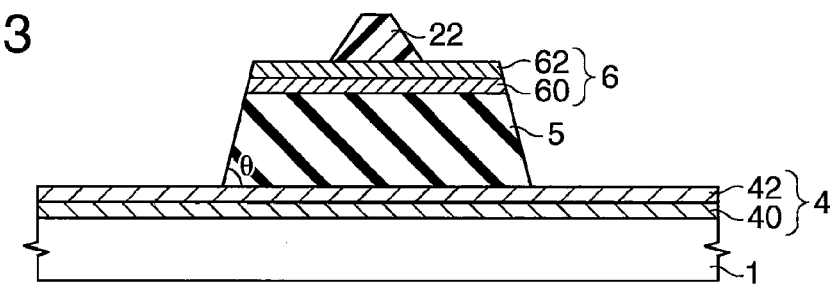
FIG. 3 is a cross-sectional view schematically showing a step of the method for manufacturing a capacitor in accordance with an embodiment of the invention.

First, as shown in FIG. 3, the second conductive layer 60 is etched by dry etching, using the resist layer 22 and the second LNO layer 62 as a mask. The second conductive layer 60 may be etched, using high density plasma such as inductively coupled plasma (ICP) of Cl$_2$ and Ar gas or the like, under a condition with a high bias power (for example about 600 W) and a low pressure (for example, 1.0 Pa or less).

Next, as shown in FIG. 3, the dielectric layer 5 is etched by dry etching, using the resist layer 22 and the second LNO layer 62 as a mask. The dielectric layer 5 may be etched, using high density plasma such as ICP of a mixed gas of chloric and fluoric gases, under a condition with a high bias power (for example about 600 W) and a low pressure (for example, 1.0 Pa or less). The mixed gas may preferably contain chloric gas in a flow quantity ratio of 60% or greater. Also, rare gas such as Ar may be added to the mixed gas. As the chloric gas, for example, BCl$_3$ and Cl$_2$ may be enumerated. As the fluoric gas, for example, CF$_4$ and C$_2$F$_6$ may be enumerated.

By etching the dielectric layer 5 under the condition described above, etching with a high etching rate (for example, 200 nm/min or more) and few micro-loading. In particular, when the dielectric layer 5 has a large film thickness (for example, 1 μm or greater), a high etching rate is very effective in improving the throughput.

In the step of etching the dielectric layer 5, the second LNO layer 62 can function as an excellent etching mask due to the following reason.

The dielectric layer 5 can be composed of a perovskite oxide expressed by a general formula ABO$_3$, as described above. The element A may include Pb, and the element B may include at least one of Zr and Ti. As indicated in Table 1 below, the melting point of chloride of Pb and Zr, and chloride and fluoride of Ti is 500° C. or lower. On the other hand, the melting point of chloride and fluoride of La and Ni which are composing elements of the second LNO layer 62 is 850° C. or higher. For this reason, the dielectric layer 5 is readily etched in chemical reaction, and the second LNO layer 62 is difficult to be etched in chemical reaction by the mixed gas of chloric and fluoric gases. For example, under the etching condition described above, the etching selection ratio of the dielectric layer 5 to the second LNO layer 62 (=etching rate of the dielectric layer 5/etching rate of the second LNO layer 62) can be set to about 7.5. In this manner, according to the present embodiment, the etching selection ratio of the dielectric layer 5 to the second LNO layer 62 can be set to 7 or greater. It is noted that, by appropriately changing the etching condition (for example, lowering the bias power, increasing the pressure and the like), the etching selection ratio can be controlled.

TABLE 1

| Element | Melting Point of Chloride (° C.) | Melting Point of Fluoride (° C.) |
| --- | --- | --- |
| Pb | 500 | 953 |
| Zr | 437 | 932 |
| Ti | −24 | 284 |
| Bi | 234 | 649 |
| Sr | 874 | 1477 |
| Ca | 782 | 1418 |
| Ba | 962 | 1368 |
| Nb | 205 | 79 |
| Si | −69 | −90 |
| Ta | 210 | 280 |
| La | 859 | 1493 |
| Ni | 1001 | 1450 |

Also, when the dielectric layer 5 is composed of a perovskite oxide expressed by a general formula ABO$_3$, as described above, the element A may include, for example, Bi, La, Sr, Ca or Ba, in addition to Pb. Among these elements, La, Sr, Ca and Ba are low in chemical reactivity to chloric and fluoric gases, as understood from Table 1. However, when they are included at the A site at a ratio of 20% or less, the influence that may be caused by the low chemical reactivity can be minimized.

Furthermore, as described above, the element B can include, for example, Nb. As shown in Table 1, the melting point of chloride and fluoride of Nb is low, such that chemical-reactive etching of the dielectric layer 5 including Nb can be readily conducted. Also, as described above, Si can be added to a perovskite oxide expressed by the general formula ABO$_3$. As shown in Table 1, the melting point of chloride and fluoride of Si is low, such that chemical-reactive etching of the dielectric layer 5 including Si can be readily conducted.

Moreover, as described above, as the dielectric layer 5, for example, SrBi$_2$Ta$_2$O$_9$ (SBT) may also be used. As shown in Table 1, the melting point of chloride and fluoride of Sr is high, but the melting points of the other elements (Bi and Ta) are low, such that chemical-reactive etching of SBT can be readily conducted. Also, as described above, at least one of Si and Nb can be added to SBT. As shown in Table 1, the melting point of chloride and fluoride of Si and Nb is low, such that chemical-reactive etching of SBT including at least one of Si and Nb can be readily conducted.

In this manner, by using the second LNO layer 62 as a mask upon etching the dielectric layer 5, etching with a few mask-receding can be conducted. In other words, the angle (taper angle) θ between the side surface of the dielectric layer 5 after etching and the horizontal surface (the upper surface of the first LNO layer 42) can be made close to 90 degrees.

Also, in the present embodiment, the resist layer 22 used at the time of patterning the second LNO layer 62 may be used together with the second LNO layer 62 as an etching mask for etching the dielectric layer 5, whereby etching with a fewer mask-receding can be conducted. According to the present embodiment, the taper angle θ can be made to, for example, about 75 degrees.

Also, in the step of etching the dielectric layer 5, the dielectric layer 5 is easy to be etched, and the LaNiO₃ layer is difficult to be etched, as described above, such that the first LNO layer 42 can function as an excellent etching stopper layer. By this, the amount of remaining film of the lower electrode 4 (the film thickness of the lower electrode 4) composed of the first conductive layer 40 and the first LNO layer 42 can be made uniform within the wafer surface. According to the present embodiment, because the first LNO layer 42 functions as an excellent etching stopper layer, differences in the amount of remaining film of the lower electrode 4 can be controlled within the range of about ±17 nm, for example, when the film thickness of the dielectric layer 5 is 1.1 μm, the film thickness of the lower electrode 4 at the time of film formation is between 200 nm and 300 nm, and the uniformity of etching is ±10%.

It is noted that, by appropriately changing the etching condition described above (for example, lowering the bias power, increasing the pressure and the like), the etching selection ratio of the dielectric layer 5 to the first LNO layer 42 (=etching rate of the dielectric layer 5/etching rate of the first LNO layer 42) can be controlled. Also, for example, the etching condition can be changed from a condition suitable for etching the dielectric layer 5 to a condition for improving the etching selection ratio of the dielectric layer 5 to the first LNO layer 42 immediately before the lower electrode 4 is over-etched.

Figure 4:
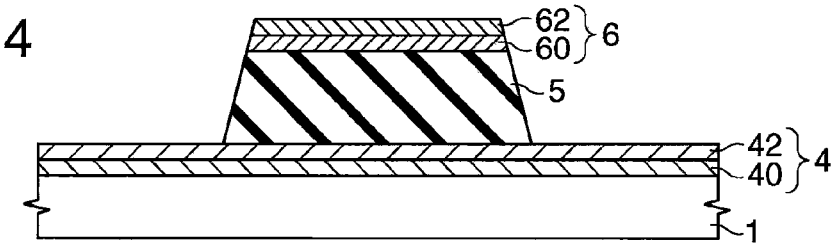
FIG. 4 is a cross-sectional view schematically showing a step of the method for manufacturing a capacitor in accordance with an embodiment of the invention.

(4) Next, as shown in FIG. 4, the remaining portion of the resist layer 22 is removed by a known method. Then, a plasma treatment is conducted depending on the requirements, whereby chloride and fluoride adhered to the surface of the first LNO layer 42 and the second LNO layer 62 during the etching steps described above can be removed. By this, electrical characteristics of the first LNO layer 42 and the second LNO layer 62 can be recovered. For the plasma treatment, for example, oxygen plasma, plasma of a mixture of oxygen and fluorine, or the like can be used.

Figure 5:
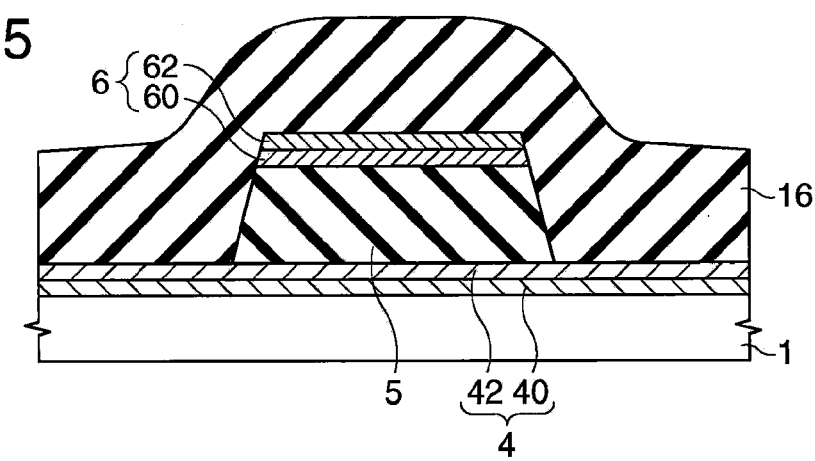
FIG. 5 is a cross-sectional view schematically showing a step of the method for manufacturing a capacitor in accordance with an embodiment of the invention.

(5) Next, as shown in FIG. 5, a silicon oxide ($SiO_2$) layer 16 is formed in a manner to cover the lower electrode 4, the dielectric layer 5 and the upper electrode 6. The silicon oxide layer 16 may be formed with, for example, trimethoxysilane (TMS). The silicon oxide layer 16 may be formed to a film thickness of, for example, between 100 nm and 200 nm.

The silicon oxide layer 16 may be formed by, for example, a chemical vapor deposition (CVD) method. As the CVD method, for example, a dual frequency plasma CVD method in which a RF (radio frequency) power is applied to both of the plasma source side and the bias side can be used. Also, as the CVD method, for example, a single frequency plasma CVD method in which a RF power is applied only to the plasma source side can be used. As an oxidizing agent to be used for the CVD method, for example, oxygen ($O_2$) and dinitrogen monoxide ($N_2O$) can be enumerated.

(6) Next, a heat treatment may be conducted depending on the requirements. By this, characteristics of the capacitor can be improved. The heat treatment temperature may be, for example, about 450° C.

Figure 6:
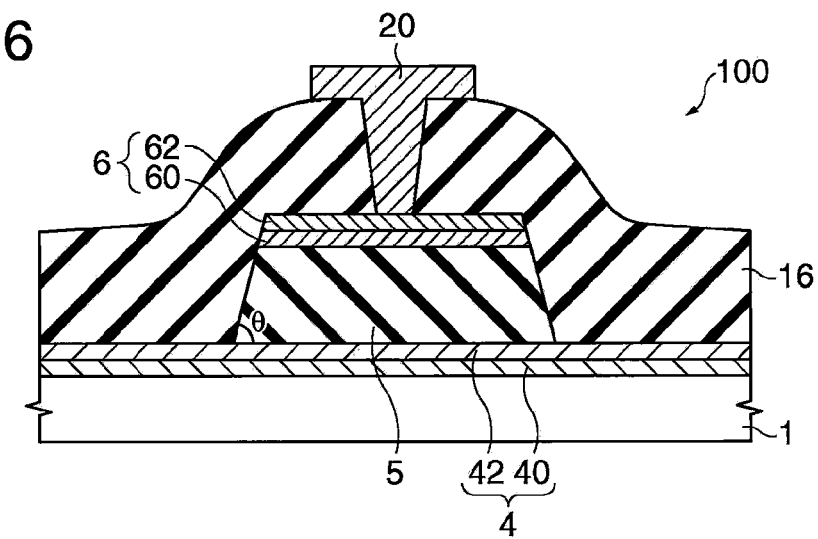
FIG. 6 is a cross-sectional view schematically showing a step of the method for manufacturing a capacitor in accordance with an embodiment of the invention.

(7) Then, a contact hole that penetrates the silicon oxide layer 16 can be formed on the upper electrode 6. The contact hole may be formed by etching a desired region of the silicon oxide layer. Next, as shown in FIG. 6, a wiring layer 20 that embeds the contact hole may be formed. The wiring layer 20 can be formed by, for example, a sputter method. The wiring layer 20 may be composed of, for example, aluminum.

(8) By the process described above, as shown in FIG. 6, the capacitor 100 in accordance with the present embodiment is fabricated.

2. In accordance with the embodiment described above, the second LNO layer 62 has an etching characteristic in that it has a low reactivity to an etching gas (for example, a mixed gas of chloric and fluoric gases) with which the dielectric layer 5 can be etched well, and a lower etching rate than that of the dielectric layer 5 in etching that uses physical actions. Accordingly, the second LNO layer 62 can function as an excellent hard mask in etching the dielectric layer 5. By this, steep etching can be conducted, and the capacitor 100 being micro-processed can be provided. In particular, the invention is very useful in conducting micro-fabrication in micro electro mechanical systems (MEMS) that may require processing thick films of the dielectric layer 5.

Also, $LaNiO_3$ that composes the second LNO layer 62 is a conductive oxide, such that the second LNO layer 62 can function as a portion of an electrode of the capacitor 100, after having functioned as an etching mask.

Also, in accordance with the present embodiment, the dielectric layer 5 is formed on the first LNO layer 42. $LaNiO_3$ that composes the first LNO layer 42 is readily oriented to (100), and therefore the dielectric layer 5 formed thereon can be oriented to (100). The dielectric layer 5 that is oriented to (100) can have good piezoelectric characteristics.

Also, the first LNO layer 42 can function as an excellent etching stopper layer in etching the dielectric layer 5. By this, the amount of remaining film of the lower electrode 4 can be made uniform within the wafer surface, and the capacitor 100 with high reliability can be provided. In particular, when the capacitor 100 of the present embodiment is applied as a piezoelectric actuator in an ink jet recording head or the like, capacitors with few differences in the amount of displacement can be provided by the present embodiment.

Also, $LaNiO_3$ that composes the first LNO layer 42 is a conductive oxide, such that the first LNO layer 42 can function as a portion of an electrode of the capacitor 100, after having functioned as an etching stopper layer.

Also, in accordance with the present embodiment, the silicon oxide layer 16 is in contact with the upper surface of the first LNO layer 42, and the side surface and upper surface of the second LNO layer 62. $LaNiO_3$ that composes the first LNO layer 42 and the second LNO layer 62 and $SiO_2$ that composes the silicon oxide layer 16 achieve excellent adhesion, such that, in accordance with the present embodiment, exfoliation of the silicon oxide layer 16 can be prevented.

3. Next, capacitors in accordance with modified examples of the embodiment and their manufacturing methods are described with reference to the accompanying drawings. It is noted that features different from the capacitor 100 and its manufacturing method described above (hereafter referred to as the "example of the capacitor 100") are described, and description of similar aspects is omitted.

Figure 7:
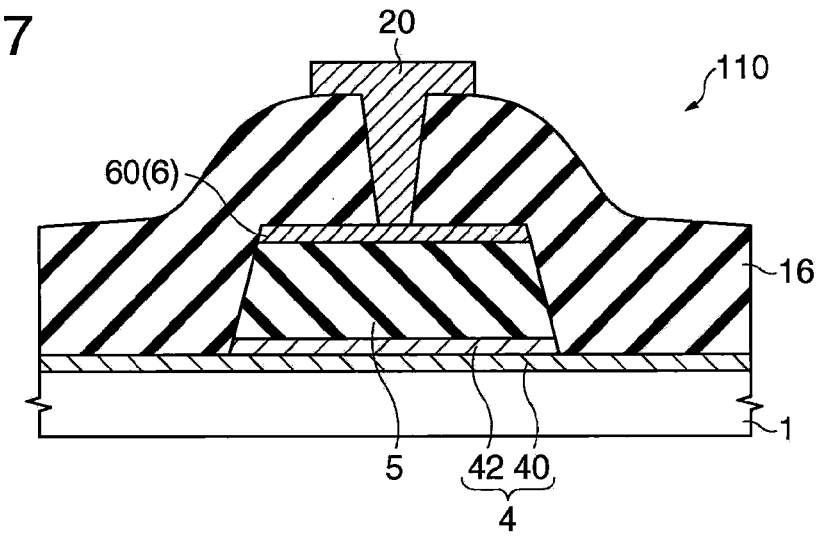
FIG. 7 is a cross-sectional view schematically showing a capacitor in accordance with a modified example of the embodiment of the invention.

(1) First, a first modified example is described. FIG. 7 is a schematic cross-sectional view of a capacitor 110 in accordance with the first modified example.

In the first modified example, exposed portions of the first LNO layer 42 (the first LNO layer 42 that is not covered by the dielectric layer 5) and the second LNO layer 62 may be removed, in the step of removing the resist layer 22 that is conducted in the example of the capacitor 100 (see FIG. 4), or after the oxygen plasma treatment step that may be conducted depending on the requirements after the aforementioned removal step. Exposed portions of the first LNO layer 42 and the second LNO layer 62 may be removed by wet-etching, using, for example, nitric chemical (diluted nitric acid, etc.), hydrogen hexafluorosilicate solution or the like. In this instance, the first LNO layer 42 can be selectively etched with respect to the first conductive layer 40. By this, the amount of remaining film of the first conductive layer 40 (the film thickness of the first conductive layer 40) can be made uniform within the wafer surface. Similarly, the second LNO layer 62 can be selectively etched with respect to the second conductive layer 60. By this, the amount of remaining film of the second conductive layer 60 (the film thickness of the second conductive layer 60) can be made uniform. It is noted that exposed portions of the first LNO layer 42 and the second LNO layer 62 can be removed by, for example, dry-etching.

In this manner, after removing the exposed portions of the first LNO layer 42 and the second LNO layer 62, oxygen plasma treatment and heat treatment may be conducted depending on the requirements to recover, in particular, the side surface portion of the dielectric layer 5 from etching damages inflicted. Then, like the example of the capacitor 100, a silicon oxide layer 16 and a wiring layer 20 are formed, whereby the capacitor 110 in accordance with the present embodiment is fabricated, as shown in FIG. 7. In the example of the capacitor 100, the wiring layer 20 is in contact with the second LNO layer 62. However, in the first modified example, the wiring layer 20 is in contact with the second conductive layer 60. The first modified example is useful, for example, when the wiring layer 20 and the upper electrode 6 are electrically better connected to each other with the wiring layer 20 being in contact with the second conductive layer 60 rather than in contact with the second LNO layer 62. Furthermore, although not shown, the first modified example is also useful, for example, when a wiring layer is connected to the lower electrode 4, and the wiring layer and the lower electrode 4 are electrically better connected to each other with the wiring layer being in contact with the first conductive layer 40 rather than in contact with the first LNO layer 42.

Figure 8:
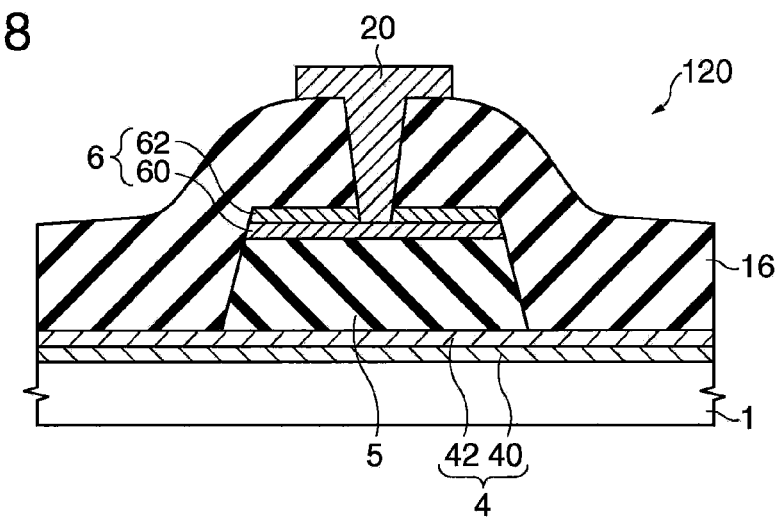
FIG. 8 is a cross-sectional view schematically showing a capacitor in accordance with a modified example of the embodiment of the invention.

Furthermore, for example, in a capacitor 120 in accordance with another example shown in FIG. 8, the second LNO layer 62 may be partially removed and the wiring layer 20 may be brought in contact with the second contact layer 60. Like the example shown in FIG. 7, this modified example is useful, for example, when the wiring layer 20 and the upper electrode 6 are electrically better connected to each other, with the wiring layer 20 being in contact with the second conductive layer 60 rather than in contact with the second LNO layer 62. It is noted that, for removing a portion of the second LNO layer 62, the second LNO layer 62 may be partially etched, using a mask, such as, for example, a resist layer. Furthermore, although not shown, the first LNO layer 42 may be partially removed, and a wiring layer may be brought in contact with the first conductive layer 40.

Figure 9:
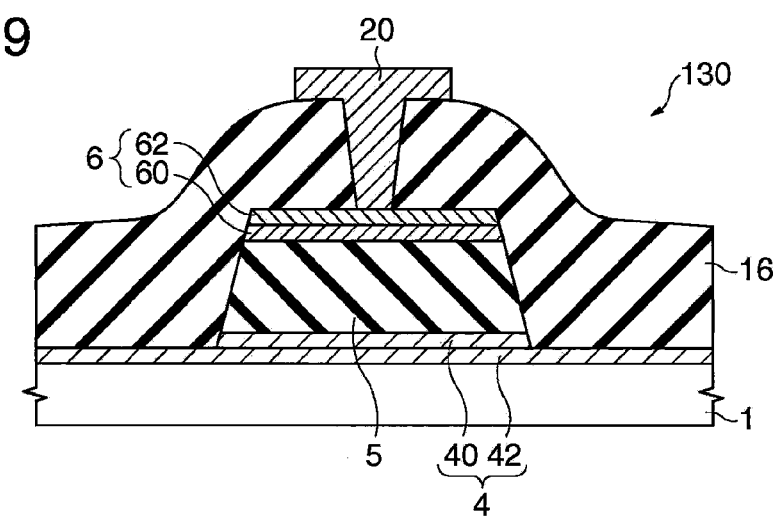
FIG. 9 is a cross-sectional view schematically showing a capacitor in accordance with a modified example of the embodiment of the invention.

(2) Next, a second modified example is described. FIG. 9 is a schematic cross-sectional view of a capacitor 130 in accordance with the second modified example.

In the example of the capacitor 100, the case in which the first LNO layer 42 is formed on the first conductive layer 40 is described. However, the order in film formation of the first conductive layer 40 and the first LNO layer 42 may be switched, and the first conductive layer 40 may be formed on the first LNO layer 42, as shown in FIG. 9. In this modified example, as the first conductive layer 40, a material that would readily be oriented to (111), for example, platinum (Pt) may be used, whereby the dielectric layer 5 can be oriented to (111). Also, in the present modified example, an exposed portion of the first conductive layer 40 (the first conductive layer 40 that is not covered by the dielectric layer 5) may be over-etched in the step of dry-etching the dielectric layer 5 (see FIG. 3), and the first LNO layer 42 can be made to function as an excellent etching stopper layer, as described above. By this, the amount of remaining film of the first LNO layer 42 can be made uniform within the wafer surface.

Figure 10:
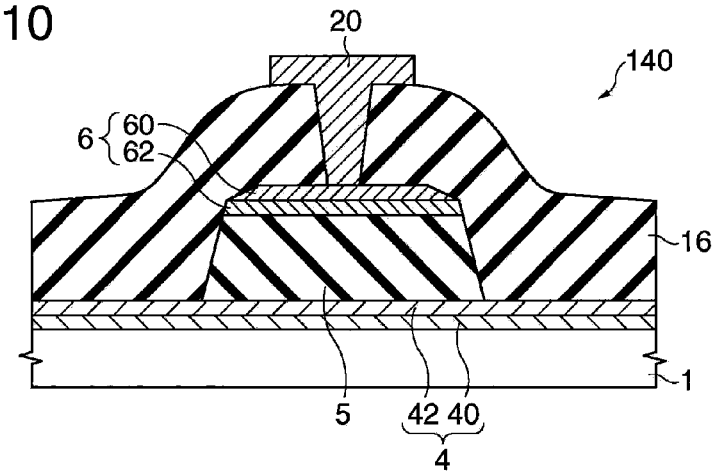
FIG. 10 is a cross-sectional view schematically showing a capacitor in accordance with a modified example of the embodiment of the invention.

(3) Next, a third modified example is described. FIG. 10 is a schematic cross-sectional view of a capacitor 140 in accordance with the third modified example.

In the example of the capacitor 100, the case in which the second LNO layer 62 is formed on the second conductive layer 60 is described. However, the order in film formation of the second conductive layer 60 and the second LNO layer 62 may be switched, and the second conductive layer 60 may be formed on the second LNO layer 62, as shown in FIG. 10. In this modified example, the silicon oxide layer 16 is in contact with the upper surface of the first LNO layer 42 and the side surface of the second LNO layer 62.

According to this modified example, the layer structure of the lower electrode 4 and the layer structure of the upper electrode 6 can be made generally symmetrical with respect to each other through the dielectric layer 5. In other words, layers composed of $LaNiO_3$ (the first LNO layer 42 and the second LNO layer 62) can be disposed on both sides of the dielectric layer 5, and conductive layers (the first conductive layer 40 and the second conductive layer 60) can be further disposed on both outer sides thereof. By this, the capacitor can have a better symmetry property. Also, by providing the layer structure described above, all of the layers from an upper layer of the lower electrode 4 to a lower layer of the upper electrode 6 (the first LNO layer 42, the dielectric layer 5 and the second LNO layer 62) can be provided with perovskite structures. In this modified example, as shown in FIG. 10, the second conductive layer 60 may slightly recede due to dry-etching. However, its lower layer, the second LNO layer 62, can function as an excellent etching mask, such that, in accordance with the present modified example, receding of the upper electrode 6 as a whole can be prevented. As a result, the capacitor 140 in an excellent configuration can be obtained.

Figure 11:
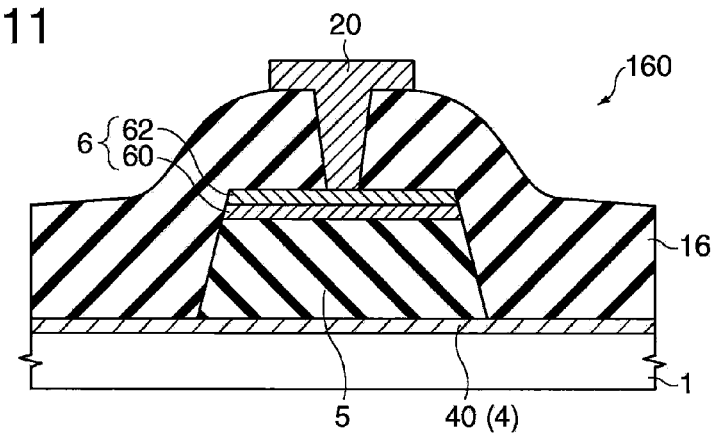
FIG. 11 is a cross-sectional view schematically showing a capacitor in accordance with a modified example of the embodiment of the invention.

(4) Next, a fourth modified example is described. FIG. 11 is a schematic cross-sectional view of a capacitor 160 in accordance with the fourth modified example.

In the example of the capacitor 100, the case in which the first LNO layer 42 functions as an etching stopper layer in the step of etching the dielectric layer 5 (see FIG. 3) is described. In contrast, in the present modified example, for example, the first LNO layer 42 may not be formed, and etching may be conducted until the first conductive layer 40 is exposed in the step of etching the dielectric layer 5. Through the steps described above, the capacitor 160 in accordance with the present modified example is fabricated, as shown in FIG. 11. In the present modified example, the second LNO layer 62 can also function as an excellent hard mask in the step of etching the dielectric layer 5 (see FIG. 3).

Figure 12:
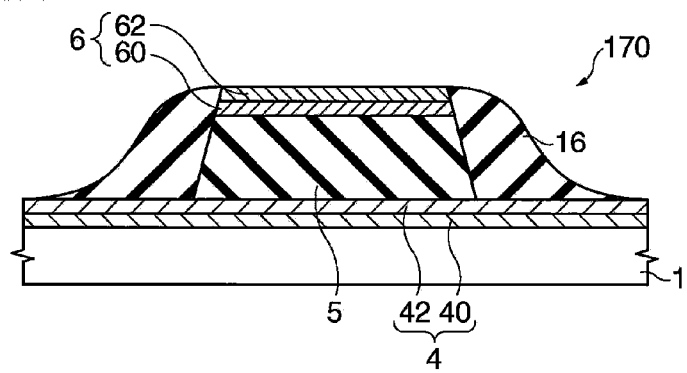
FIG. 12 is a cross-sectional view schematically showing a capacitor in accordance with a modified example of the embodiment of the invention.

(5) Next, a fifth modified example is described. FIG. 12 is a schematic cross-sectional view of a capacitor 170 in accordance with the fifth modified example.

In the example of the capacitor 100, the case in which the silicon oxide layer 16 is also formed on the upper electrode 6 is described. However, in the present modified example, as shown in FIG. 12, the silicon oxide layer 16 may not be formed on the upper electrode 6. In other words, the silicon oxide layer 16 is formed on the first LNO layer 42 and to the side of the dielectric layer 5 and the upper electrode 6. In the present modified example, the silicon oxide layer 16 is in contact with the upper surface of the first LNO layer 42, and with the side surface of the second LNO layer 62. $LaNiO_3$ that composes the first LNO layer 42 and the second LNO layer 62 and $SiO_2$ that composes the silicon oxide layer 16 achieve excellent adhesion, such that, in accordance with the present modified example, exfoliation of the silicon oxide layer 16 can be prevented. Also, in accordance with the present modified example, because the silicon oxide layer 16 is not formed on the upper electrode 6, for example, when the capacitor 170 is applied to a piezoelectric element, the amount of flexing that occurs at the time of driving the piezoelectric element can be increased.

Also, in the example of the capacitor 100, the case in which the wiring layer 20 is formed is described. However, the wiring layer 20 may not be formed as in the case of the present modified example, and the upper electrode 6 may be used as a wiring layer. This similarly applies to the lower electrode 4.

(6) It is noted that the modified examples described above are merely examples, and the invention is not limited to them. For example, the modified examples may be appropriately combined.

4. Embodiments of the invention are described above in detail. It is noted that a person having ordinary skill in the art can readily understand that many changes can be made without departing in substance from the novel matters and effects of the invention. Accordingly, all of these modified examples should be included in the scope of the invention.

For example, capacitors in accordance with the invention are applicable to a variety of piezoelectric elements (for example, those used in ink jet recording heads of ink jet printers, actuators, etc.), a variety of ferroelectric elements (for example, those used in ferroelectric memories, etc.) and the like.

What is claimed is:

1. A method for manufacturing a piezoelectric element, the method, comprising:

forming a conductive layer that directly contacts a base substrate;

forming a dielectric layer above the conductive layer;

forming a second conductive layer above the dielectric layer;

forming a first lanthanum nickelate layer above the dielectric layer;

etching a part of the first lanthanum nickelate layer to form a mask;

patterning the second conductive layer and the dielectric layer by using the mask; and removing the mask after the patterning of the second conductive layer and the dielectric layer.

2. The method for manufacturing a piezoelectric element according to claim 1, wherein the dielectric layer is formed to be composed of a perovskite oxide expressed by a general formula $ABO_3$, wherein A is formed to include lead (Pb), and B is formed to include at least one of zirconium (Zr) and titanium (Ti).

3. The method for manufacturing a piezoelectric element according to claim 1, comprising the step of applying plasma processing to at least the first lanthanum nickelate layer, after the step of patterning.

4. The method for manufacturing a piezoelectric element according to claim 1, comprising the step of forming a second lanthanum nickelate layer, before the step of forming the dielectric layer, wherein the step of patterning is conducted until the second lanthanum nickelate layer is exposed.

5. The method for manufacturing a piezoelectric element according to claim 4, comprising, after the step of patterning, the step of removing at least a portion of at least one of the first lanthanum nickelate layer and the second lanthanum nickelate layer.

6. A method of manufacturing an actuator comprising the method of manufacturing a piezoelectric as defined in claim 1.

7. A method of manufacturing an ink jet head comprising the method of manufacturing a piezoelectric as defined in claim 1.

\* \* \* \* \*